US007322000B2

(12) United States Patent
Colunga et al.

(10) Patent No.: US 7,322,000 B2
(45) Date of Patent: Jan. 22, 2008

(54) METHODS AND APPARATUS FOR EXTENDING SEMICONDUCTOR CHIP TESTING WITH BOUNDARY SCAN REGISTERS

(75) Inventors: Tomas V. Colunga, Tempe, AZ (US); Loren J. Benecke, Mesa, AZ (US); Joseph S. Vaccaro, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 202 days.

(21) Appl. No.: 11/117,777

(22) Filed: Apr. 29, 2005

(65) Prior Publication Data

US 2006/0248419 A1 Nov. 2, 2006

(51) Int. Cl.
 *G01R 31/28* (2006.01)
(52) U.S. Cl. ............. 714/727; 714/30; 714/729; 714/733; 714/734
(58) Field of Classification Search .................. None
 See application file for complete search history.

(56) References Cited

U.S. PATENT DOCUMENTS

| | | | | |
|---|---|---|---|---|
| 5,260,948 | A * | 11/1993 | Simpson et al. | 714/727 |
| 5,546,406 | A * | 8/1996 | Gillenwater et al. | 714/733 |
| 5,570,375 | A * | 10/1996 | Tsai et al. | 714/727 |
| 6,288,813 | B1 * | 9/2001 | Kirkpatrick et al. | 398/136 |
| 6,567,325 | B1 * | 5/2003 | Hergott | 365/201 |
| 6,574,762 | B1 * | 6/2003 | Karimi et al. | 714/727 |
| 6,671,839 | B1 * | 12/2003 | Cote et al. | 714/726 |
| 2002/0184583 | A1 * | 12/2002 | Hikone et al. | 714/726 |
| 2004/0006729 | A1 * | 1/2004 | Pendurkar | 714/733 |
| 2004/0044937 | A1 * | 3/2004 | Dubey | 714/727 |
| 2004/0123197 | A1 * | 6/2004 | Sunter et al. | 714/724 |
| 2004/0128595 | A1 * | 7/2004 | Schoenborn et al. | 714/724 |
| 2004/0187058 | A1 | 9/2004 | Yamada et al. | |
| 2004/0199840 | A1 * | 10/2004 | Takeoka et al. | 714/727 |
| 2006/0248417 | A1 * | 11/2006 | Farmer et al. | 714/724 |

OTHER PUBLICATIONS

"IEEE P1149.6:D2.3 Draft Standard for Boundary-Scan Testing of Advanced Digital Networks", Mar. 1, 2002, Draft 2.3n, p. 1 and 52.*

(Continued)

*Primary Examiner*—Guy Lamarre
*Assistant Examiner*—John P Trimmings
(74) *Attorney, Agent, or Firm*—Ingrassia Fisher & Lorenz P.C.

(57) ABSTRACT

Semiconductor devices, circuits and methods apply both system logic tests and external interface tests via a common series of boundary shift registers residing on the semiconductor chip. In an exemplary embodiment, a test access port receives an external testing signal from a source outside the semiconductor device, and an on-chip test module (e.g. a built-in self-test (BIST) module) contained within the semiconductor device provides an internal testing signal for the system logic. Control logic selectively provides appropriate input testing signals to the boundary shift registers and receives and processes appropriate output signals from the boundary shift registers in each testing mode. Using the various control techniques, a common set of boundary scan registers may be used to implement, for example, an IEEE 1149.1 interface, a BIST isolation wrapper scan chain, a BIST-mode input/output control, or the like.

18 Claims, 9 Drawing Sheets

OTHER PUBLICATIONS

Makar et al., "IDDQ Test Pattern Generation for Scan Chain Latches and Flip-Flops," Center for Reliable Computing, Stanford University.

Chakraborty et al., "Enhanced Controllability for IDDQ Test Sets Using Partial Scan," 28th ACM/IEEE Design Automation Conference, Paper 18.2, pp. 278-281.

Cook et al., "Advanced Test Part 2: New Design-For-Test Strategies Tackle Comms IC Changes," http://www.commsdesign.com/showArticle.jhtml?articleID=16506390 , Dec. 2, 2002.

Kapur et al., "New approach moves logic BIST into mainstream," http://www.eetimes.com/story/OEG2002101450081, Oct. 14, 2002.

Stephen Pateras, "BIST versus ATPG—separating myths from reality," http://www.eetimes.com/story/OEG2002112750040, Nov. 27, 2002.

"IEEE Std 1149.1 (JTAG) Testability Primer," Texas Instruments, 1996.

* cited by examiner

| BSR CELL CONTROL SIGNALS | EXTERNAL MODE (LBM=0) | | INTERNAL MODE (LBM=1) | |
| --- | --- | --- | --- | --- |
| MODE | MODE | JTAG BSR INSTRUCTION CONTROL | LOGIC HIGH | MAINTAIN ISOLATION WRAPPER CHAIN INTEGRITY AND FACILITATE I/O CONTROL |
| MODE_1 | MODE_1 | | LOGIC HIGH | |
| MODE_2 | MODE_2 | | LOGIC HIGH | |
| MODE_3 | MODE_3 | | LOGIC HIGH | |
| UPDATEDR | UPDATEDR | SCAN CONTROL | UPDATEDR | NOT USED |
| SHIFTDR | SHIFTDR | | SCAN SHIFT ENABLE | SCAN CONTROL |
| CLOCKDR | CLOCKDR | | SCAN CLOCK | |
| SERIAL_INPUT | TDI | BSR INPUT – FROM EXT. I/O | DRIVEN BY BIST | ISOLATION WRAPPER INPUT |
| SERIAL_OUTPUT | TDO | JTAG OUTPUT – TO EXT. I/O | INPUT TO BIST | ISOLATION WRAPPER OUTPUT |

METHODS AND APPARATUS FOR EXTENDING SEMICONDUCTOR CHIP TESTING WITH BOUNDARY SCAN REGISTERS

TECHNICAL FIELD

The present invention generally relates to semiconductor chip testing, particularly testing of semiconductor chip logic using boundary scan registers.

BACKGROUND

Semiconductor chips continue to have a monumental impact upon our society, and are presently used in devices ranging from computers to telephones to automobiles and the like. Indeed, any modern device that performs any type of computing, control, electronic sensing, communications or the like typically includes at least several controllers, memories, processors or other integrated logic circuits implemented on a semiconductor chip. Many conventional semiconductor chips now include thousands, millions or even more transistors capable of completing complex data processing tasks in fractions of seconds.

As semiconductor chips and their associated manufacturing techniques become increasingly complex, however, the need arises for enhanced testing techniques. In recent years, so-called "design for test" (DFT) practices that incorporate testing mechanisms into the design of a chip have become prevalent in the semiconductor industry. IEEE Standard 1149.1 (commonly called the "JTAG" standard after the Joint Test Action Group that originally formulated the standard), for example, describes a widely-implemented hardware specification that can be used to test interconnectivity between chips operating on a common circuit board. Chips built in accordance with the JTAG standard include a test access port (TAP) for placing signals onto chip interface pins via boundary shift registers (BSRs) that serially connect each pin on the chip to the TAP. By applying proper signals to the TAPs associated with various chips on a circuit board, engineers can perform debugging and diagnostic tests to isolate and correct manufacturing defects such as unconnected pins, missing devices, incorrectly placed or rotated devices, or the like.

While JTAG is intended primarily as a system-level test, other DFT constructs provide testing for logic contained within the chip itself. "Built-in self test" (BIST) modules and/or "automatic test pattern generation" (ATPG) features, for example, are becoming increasingly prevalent. Conventional BIST and ATPG typically exploit chains of interconnected storage elements (e.g. flip flops, latches, etc.) within the chip to serially process applied test data. The results of the test for each chain are then compared against known results to identify faults occurring within the chain, and in logic between the chains. While these techniques can be effective in identifying internal faults within the chip, their usefulness can be limited in practice, particularly with regard to tests that call for a system logic isolation wrapper, which can be cumbersome to implement using conventional testing circuitry.

As a result, it is desirable to formulate a technique for effectively testing the logic contained within a semiconductor chip without significantly increasing the amount of circuitry present on the chip. In addition, it is desirable to expand currently-available BSR capabilities to extend testability control in various environments. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Boundary scan registers commonly found on many conventional semiconductor chips can be modified to extend test control and/or to provide an isolation wrapper for various tests of internal system logic performed by a built-in self-test (BIST) module or the like. In various exemplary embodiments, a test access port residing on the semiconductor chip receives an external testing signal from a source outside the semiconductor device, and an on-chip test module (e.g. a built-in self-test (BIST) module) contained within the semiconductor device provides an internal testing signal for the system logic. Alternatively or additionally, internal testing signals may be received from an external source such as an automatic test pattern generation (ATPG) tester or the like. Control logic selectively provides appropriate input testing signals to the boundary shift registers and receives and processes appropriate output signals from the boundary shift registers in each testing mode. Using the various control techniques, a common set of boundary scan registers may be used to implement, for example, an IEEE 1149.1 interface, an isolation wrapper scan chain for internal logic testing, a BIST-mode input/output control, or the like. Conventional boundary shift register constructs are therefore enhanced to provide testing of internal logic (e.g. via BIST, ATPG or similar techniques) without sacrificing external interface test capability, thereby resulting in an easy-to-implement yet powerful and flexible design for test (DFT) implementation.

Although the various embodiments of the invention can vary significantly in practice, certain advantages available from exemplary implementations include the ability to provide a variety of internal and external tests using the boundary scan registers without significant additional logic present on the chip. Moreover, design of the new testing logic is relatively straightforward because many conventional computer-aided design tools automate the design of IEEE 1149.1 constructs. By re-using this automatically-designed logic to additionally test internal logic within the semiconductor chip, widely-available design tools can be exploited to automate much of the design process. Further, various embodiments can incorporate logic isolation techniques for a particular design across a variety of package formats, thereby allowing a common operating environment for the logic BIST (or the like) that allows logic testing that is independent of the die or package configuration of the chip. Still further, the application of both internal and external tests by the BSRs can provide improved test coverage for the semiconductor chip beyond that which was previously available. Input/output enable logic residing outside of the BSR, for example, can be tested using the BSRs. By using the BSRs for logic BIST or other logic testing, then, a number of improvements and benefits can be realized. Again, the particular benefits and results can be modified to suit the particular implementation, and may therefore vary widely from embodiment to embodiment.

Figure 1:
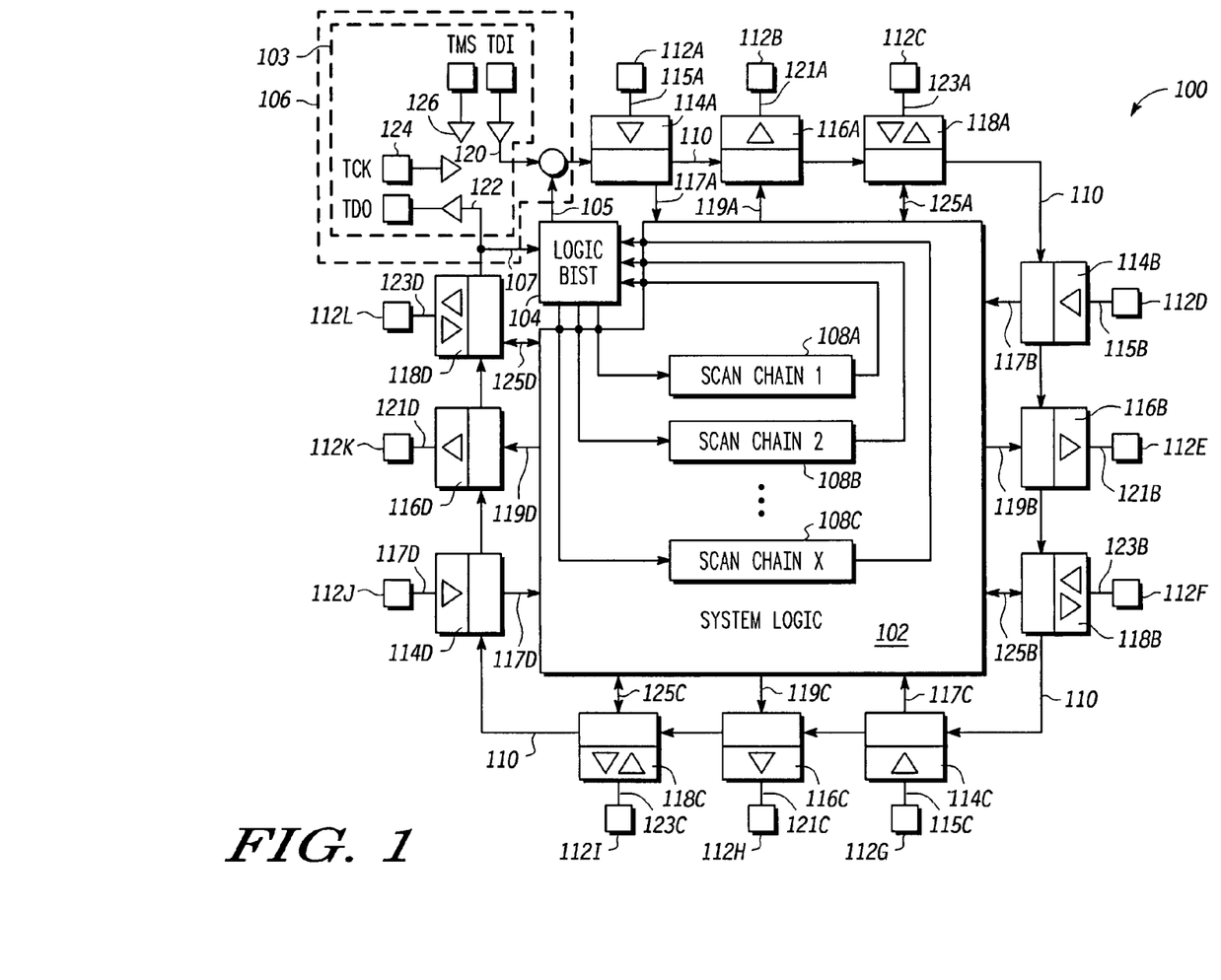
FIG. 1 is a block diagram of an exemplary system for testing internal logic with boundary scan registers.

Turning now to the drawing figures and with initial reference to FIG. 1, an exemplary semiconductor chip 100 suitably includes system logic 102 communicating with any number of interface pins 112A-L via one or more boundary scan registers 114, 116, 118. The various boundary scan registers 114, 116, 118 are appropriately connected to form a serial chain 110 that can be used, for example, in conventional JTAG/IEEE 1194.1 interface tests in conjunction with a test access port 103. Further, a logic built-in self test (BIST) module 104 on chip 100 suitably applies any number of test chains 108 to logic 102 using conventional techniques. In various alternate but equivalent embodiments, BIST module 104 may be replaced or supplemented by external testing features that apply input signals (e.g. test vectors) to test chains 108. Because BSRs 114, 116, 118 are serially interconnected to form serial chain 110, BIST module 104 (or its external equivalent) is able to apply boundary isolation and/or other internal tests using chain 110. This feature is provided by augmenting chip 100 with control logic 106 that appropriately receives input signals from TAP 103 and BIST 104, determines whether the desired test is an internal test from BIST 104 or and external test emanating from TAP 103, applies the appropriate signals to BSR chain 110, and receives and process resulting output signals from BSR chain 110 as appropriate.

Boundary scan registers (BSRs) 114, 116, 118 are any interface circuits capable of coupling system logic 102 to one or more external interface pads/pins 112. In various embodiments, BSRs 114, 116, 118 are configured in accordance with any version of the IEEE 1194.1 "JTAG" standard, which provides a standard interface testing interfaces between chips residing on a common circuit board. Various data and/or command signals (e.g. signals 120, 124, 126) are received from an external source via a test access port (TAP) 103 and applied to each BSR via serial channel 110. Similarly, a serial output signal 122 is received from serial channel 110 and provided to an external source via TAP 103. BSRs 114, 116, 118 may therefore be conceptualized as serially-connected chain of shift registers capable of serially receiving, applying and forwarding data on chain 110.

Different types of BSRs used in various embodiments may include uni-directional boundary scan input circuits 114, unidirectional boundary scan output circuits 116, bi-directional boundary scan input/output circuits 118, boundary scan driver circuits, and/or the like. Although the exemplary embodiment shown in FIG. 1 includes twelve BSRs arranged as four input circuits 114A-D, four output circuits 116A-D and four bi-directional circuits 118A-D, alternate embodiments may include any types or combinations of circuits as appropriate for the particular implementation of chip 100 desired. Further, although the various BSRs shown in FIG. 1 each directly couple system logic 102 to a particular interface pad 112, other embodiments may include BSRs that perform other functions and/or that are not directly or uniquely associated with a particular interface pad, as described more fully below.

Control circuitry 106 is any circuit or logic on semiconductor chip 100 that is capable of receiving test data from various input sources and generating appropriate control and/or data signals to be provided to chain 110 to implement various types of internal and external tests. In an exemplary embodiment, control circuitry 106 supplements a conventional JTAG test access port (TAP) 103 that receives data input (TDI) signals 120, clock (TCK) signals 124, mode select (TMS) signals 126, and/or the like, and that provides a conventional data output (TDO) signal 122 as appropriate. Control circuitry 106 additionally provides a switching mechanism that allows for application of signals 105 received from BIST module 104 (or an equivalent external source) to chain 110, as described more fully below. By selectively applying both internal logic testing signals 105 and JTAG signals 120 to the BSRs via a common serial chain 110, conventional JTAG signaling and processing constructs can be expanded to perform both internal and external testing with a common series 110 of BSRs. "Internal" testing in this sense refers to any testing performed in response to BIST module 104 or any equivalent, whereas "external" testing refers to interface testing (e.g. conventional JTAG testing) and/or the like performed without primary focus on system logic 102. Examples of internal tests that may be provided in various embodiments include any tests that use the BSRs to isolate interface pads 112 from logic 102, that use the BSRs to apply known input values to logic 102 from various input locations, that receive and/or process outputs received in the BSRs from logic 102, and/or the like. Again, although the internal tests are occasionally referenced herein as "BIST" tests for simplicity, the logic BIST module 104 present on chip 100 may be equivalently replaced and/or supplemented with any other source of logic testing signals, including any ATPG or other testing device capable of providing internal test signals 105 via interface pins 112 and/or access port 103. Similarly, external tests may variously include conventional JTAG tests, and/or any other interface tests performed in response to sources external to chip 100. Additionally, various embodiments may be configured such that TAP 103 is used as an external interface to direct and/or monitor internal testing, as described more fully below.

In operation, then, BSRs 114, 116, 118 can be used to apply both internal tests of system logic 102 and external tests of interface pins/pads 112. External tests may be initiated by signals (e.g. signals 120, 124, 126) received from outside chip 100 via TAP 103, and internal tests may be initiated by signals 105 emanating from BIST 104 or any other source, as described above. Control logic 106 suitably applies the appropriate signals to serial chain 110 based upon the desired mode, and forwards testing results (e.g. signals 107, 122) to the appropriate recipient. Internal testing of logic 102 can therefore be provided through supplement and re-use of conventional TAP 103 and BSR 114, 116, 118 constructs.

Figure 2:
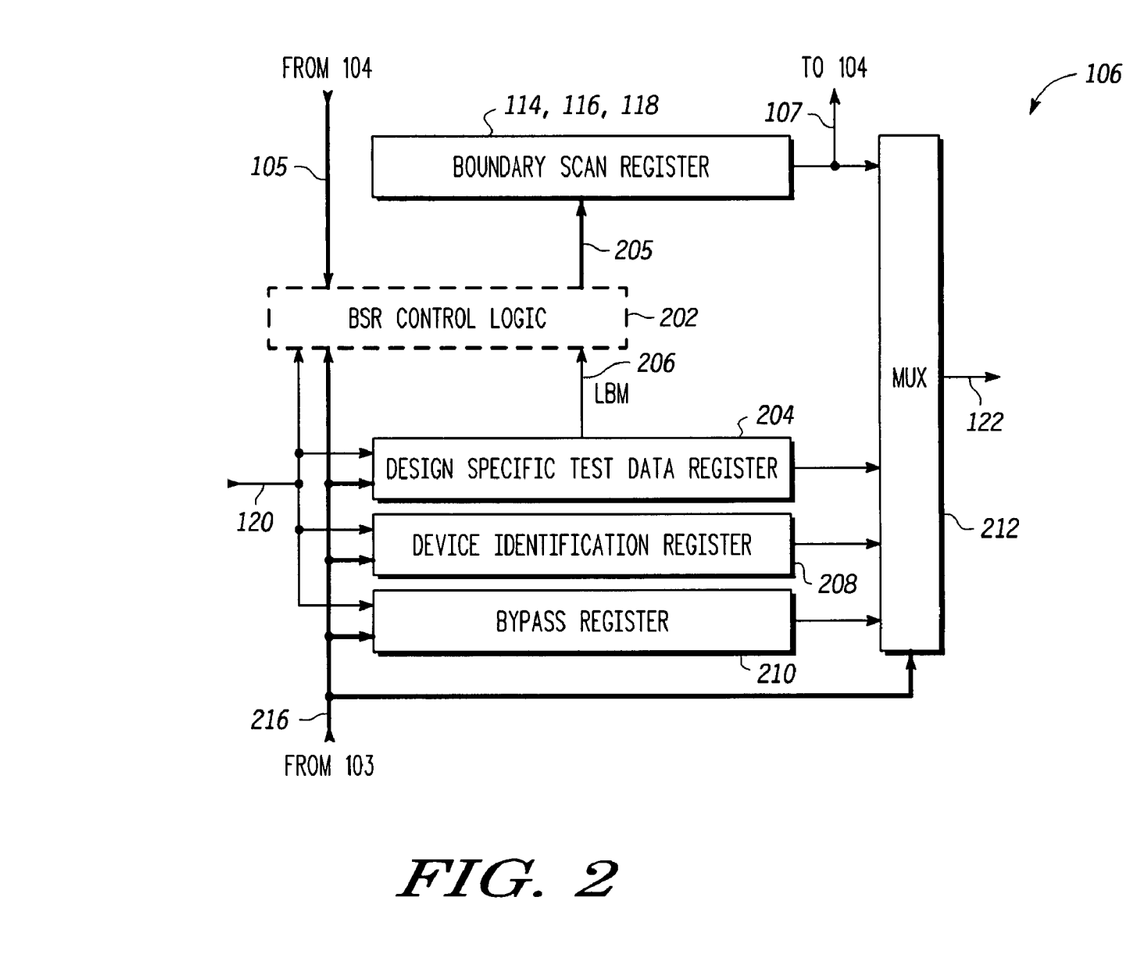
FIG. 2 is a block diagram of an exemplary control system capable of using boundary scan registers as an isolation wrapper scan chain.

With reference now to FIG. 2, an exemplary control circuit 106 suitable for use in applying both internal and external testing suitably includes logic 202 that supplements conventional JTAG registers 204, 208, 210 to route signals 105 onto chain 110. Control logic 202 suitably extracts mode selection and/or data signals from internal and/or external sources, generates corresponding control and/or data signals in response to the mode selection signals, applies the control/data signals to the relevant BSRs 114, 116, 118, and provides resulting output signals to BIST module 104, TAP 103 and/or any other destination as appropriate. Control logic 202 therefore supplements conventional JTAG TAP functionality presently found on many semiconductor chips to achieve additional benefits from boundary register chain 110.

Control circuitry 106 used to control BSRs 114, 116, 118 can be readily constructed by supplementing conventional JTAG constructs. The JTAG standard specifies certain registers and control signals, for example, that can be readily re-used during internal test modes. Examples of conventional JTAG registers include parallel-connected bypass register 210 and device identification register 208, as well as a conventional design-specific test data register 204. Mulitplexer 212 conventionally combines the serial output signals emanating from registers 204, 208, 210 with the output 107 of serial chain 110 (e.g. using time division multiplexing or a similar technique) to provide serial output signal 122 to TAP 103.

As set forth in the JTAG standard, one or more data fields in any signals 216 provided by TAP 103 (e.g. signals 120, 124, 126 in FIG. 1) can be user defined to specify additional features, such as a test mode. This data field is then monitored by test data register 204 to extract one or more control signals 206 as appropriate. In an exemplary embodiment, one or more bits in received data 216 (e.g. data received on serial mode select pin 126 in FIG. 1) can be defined as a test indicator that can be monitored by register 204. Register 204 suitably provides an indication 206 of this data field as data 216 is received select between various internal and/or testing modes of control logic 202. Using this technique, internal and external testing modes may be indicated or controlled by an external source via TAP 103. Mode selection signals may be additionally or alternatively provided to control logic 202 from BIST 104 (e.g. using signals 105), and/or from any other source. Further, mode selection signals may have any bit length (e.g. one or more bits), with additional bits providing additional testing modes or other information as appropriate. BSR control logic 202 can variously receive mode selection indication 206 from tap 103 (e.g. via signals 216 and register 204), from BIST 105 (e.g. via signal 105), or from another source. Control logic 202 therefore flexibly places chip 100 (FIG. 1) into any of various internal or external test modes based upon a value of an extracted testing mode selection signal 206 extracted from any data input 105, 216 to control circuit 106.

Figure 3:
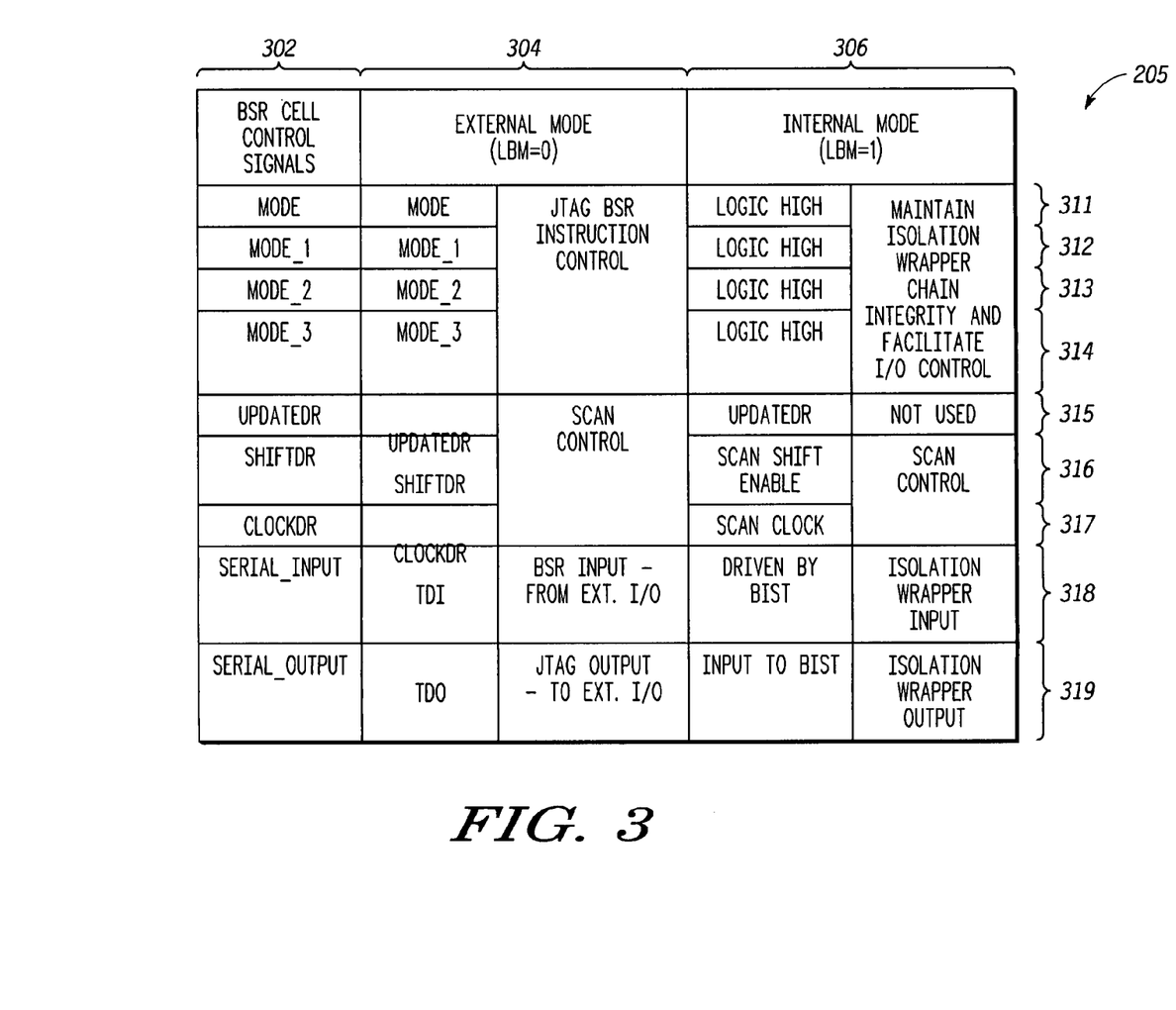
FIG. 3 is a table of exemplary signal values that could be used in an exemplary testing control system.

In response to the mode selection indication, control logic 202 further produces appropriate control and/or data signals for the BSRs to implement the desired testing modes. With momentary reference to FIG. 3, an exemplary signaling scheme uses various common control and data signals 302 to indicate certain values in external test mode 304 and other values in an internal test mode 306. Signals 311-314, for example, can collectively indicate various conventional internal or external operating modes as appropriate. Similarly, signal 316 may be used as a data shift enable signal in either mode, signal 317 may be used as a clock signal in either mode, signal 318 may be used as a data input signal in either mode, and signal 319 may be used as a data output signal in either mode. Other signals (e.g. signal 315) may have application in one mode only, and may not be used in other modes. By generating appropriate values of signals 302, then, the BSRs can be placed into any desired operating mode. The particular signaling scheme 205 shown in FIG. 3 is simply one example that shows re-use of conventional JTAG signals for internal testing; other embodiments may use radically different signals and mappings to implement similar concepts.

Figure 4:
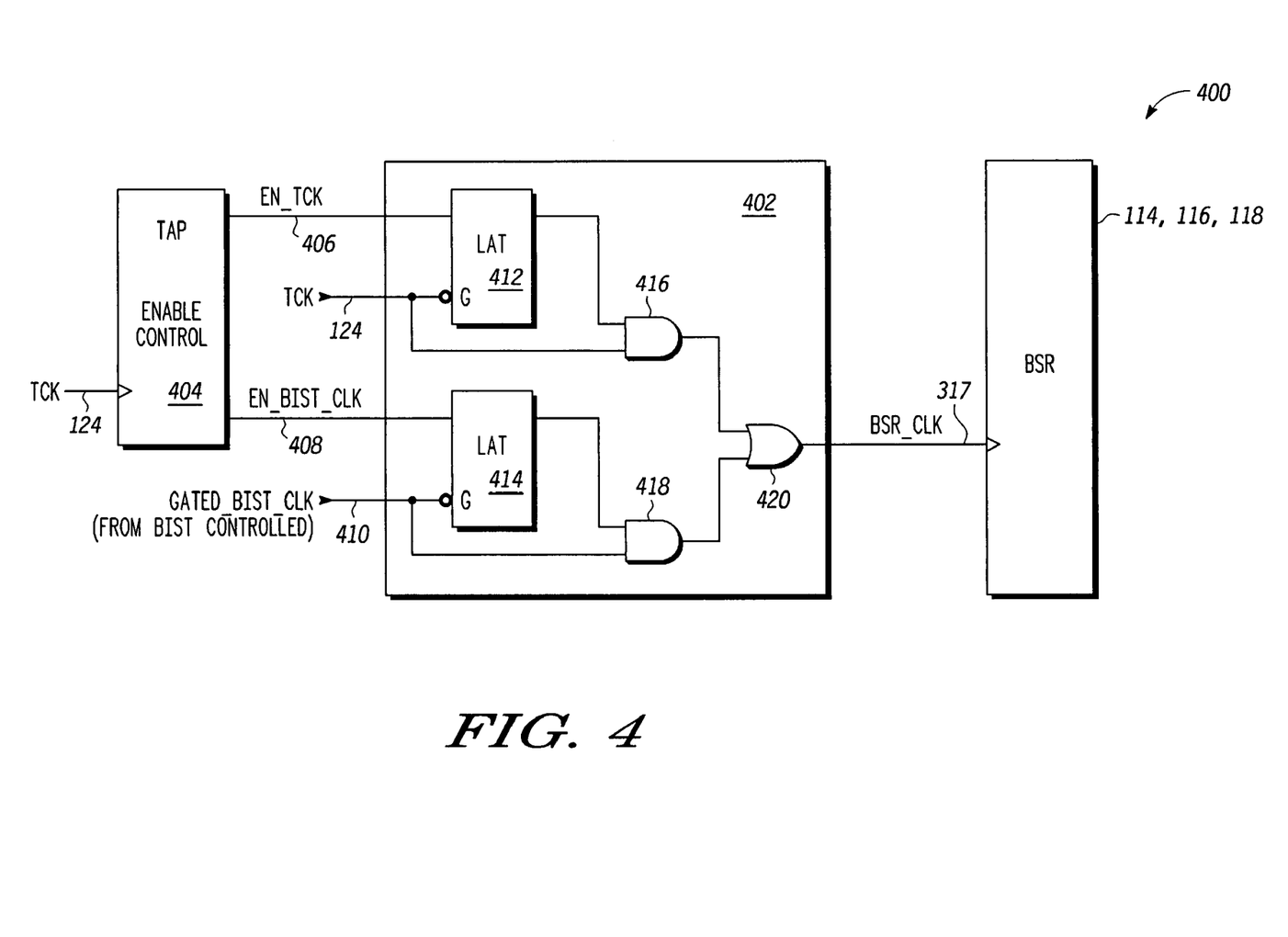
FIG. 4 is a logic diagram of an exemplary clock signal switching technique.

Although various signals 311-319 may have common functions in both modes 304 and 306, the particular values placed upon these signal lines at various times can be determined by control logic 202 as appropriate. FIG. 4, for example, shows an exemplary technique for producing an appropriate clock signal 317 applied to the various BSRs between an externally-applied clocking signal 124 and an internally-applied clock signal 410 received from BIST 105 or another appropriate source. FIG. 4 shows an exemplary embodiment in which each clock signal 124, 410 includes an enable signal (e.g. signals 406 and 408, respectively) that is provided to a control latch 412, 414 that places the appropriate clock signal 124, 410 onto control signal 317. Additional logic (e.g. gates 416, 418, 420) may also be present in various embodiments. In the exemplary circuit 400 shown in FIG. 4, for example, latches 412 and 414 are shown with an active low control input. Activating latches 412 and 414 on low values of clock signals 124, 410 and providing the latched enable signals to AND gates 416 and 418 (respectively) prevents "glitches" during clock transitions, and ensures that rising edges of each clock signal are associated with the enabled clock domain. The two clock signals resulting from gates 416 and 418 are combined in any manner (e.g. by gate 420) and provided to one or more BSRs 114, 116, 118 as clock control signal 317.

Using similar constructs for the other control signals 311-319, control logic 202 is able to flexibly place chip 100 (FIG. 1) into any of various internal or external test modes corresponding to the extracted testing mode selection signal. Referring again to FIG. 2, signals 311-314, for example, may be processed using conventional JTAG techniques in the external testing mode 304, and may be provided with appropriate reference values (e.g. logic low, logic high) in internal testing modes. These values may be placed using conventional digital logic or the like. Numerous testing procedures can therefore be implemented by controlling the values placed upon the control signals provided to BSRs 114, 116, 118.

FIGS. 5-8 show exemplary boundary scan register circuits that can be used with various embodiments. Each of these circuits suitably receive some or all of control signals 311-319 and provide signal outputs and/or perform other functions in response to the received signals. Additionally, each BSR circuit transmits and receives a serial input/output signal on chain 110. The various circuits shown in FIGS. 5-8 are exemplary, and are not intended as limiting. The multiplexer circuits shown, for example, may be implemented as conventional switching circuits or in any other manner. Practical embodiments may therefore include additional or alternate logic components, and/or may be organized in widely different ways.

Figure 5:
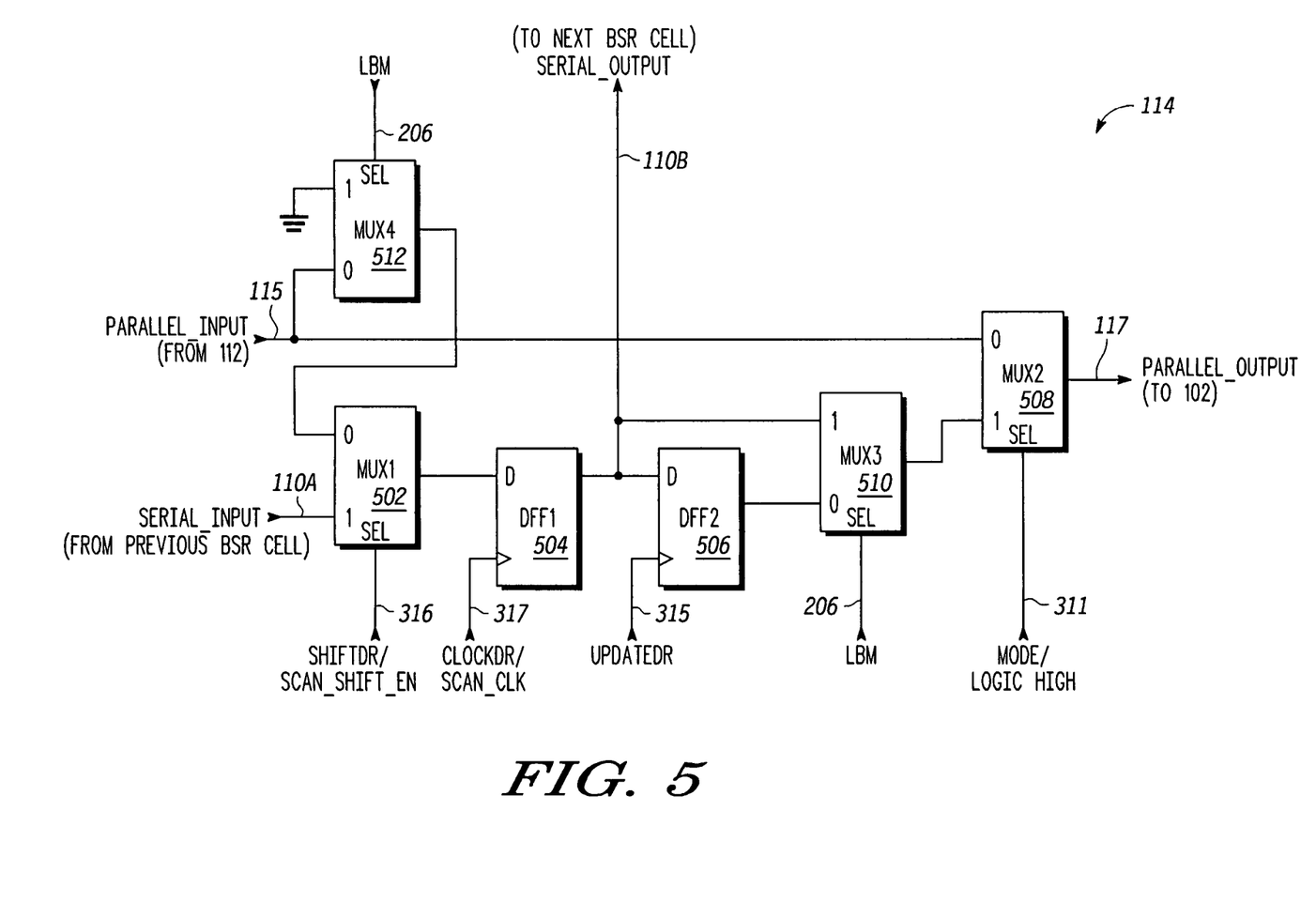
FIG. 5 is a block logic diagram of an exemplary boundary scan input cell.

FIG. 5 shows an exemplary unidirectional input circuit 114 that receives an input signal 115 from an interface pin/pad 112 and that provides an output signal 117 to system logic 102. In the embodiment shown, receiver circuit 114 contains four single-bit multiplexers 502, 508, 510, 512 and two D-type flip flop circuits 504, 506. In the normal operating mode, system logic 102 receives a signal 117 from circuit 114 corresponding to the signal 115 received on interface pin/pad 112. In the internal testing mode, however, scan chain 110 receives a pre-determined reference value (e.g. ground). Alternatively, data received on serial chain 110A can be switched to signal 117 in either the internal or the external testing modes. In the exemplary circuit shown in FIG. 5, the reference value is provided at an input of multiplexer 512. Depending on the value of mode selection signal (LBM) 206, multiplexer 512 provides either the reference value or the output of interface pad 112 to an input of multiplexer 502. The other input of multiplexer 502 is connected to the serial input 110A from control circuit 202 and/or another BSR 114, 116, 118 within chain 110. By applying appropriate values of signals 206 and 316 to multiplexers 512 and 502, respectively, any of three possible inputs (signal on pad 112, reference value or serial input 110A) can be placed within flip-flop 504, which in turn provides the selected signal as a serial output 110B and/or to gates 506, 510, 508 in accordance with an applied clock 317. Again, by adjusting the control signals 206, 315, 316, 317 and 311 applied to circuit 114, various known and unknown inputs can be applied to system logic 102 without sacrificing conventional external test capability.

Figure 6:
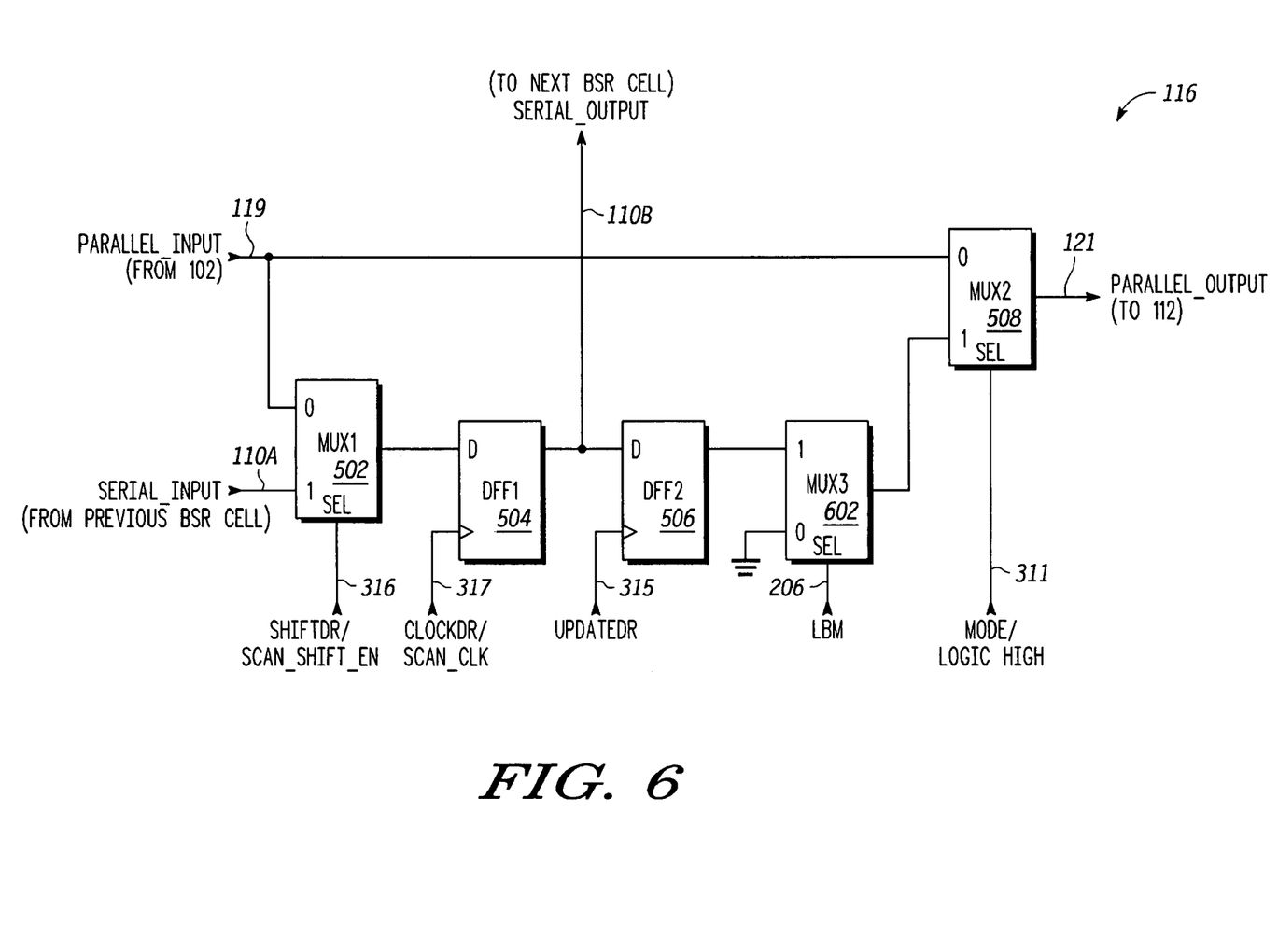
FIG. 6 is a block logic diagram of an exemplary boundary scan output cell.

FIG. 6 similarly shows a unidirectional output cell 116 that provides an output signal 121 to interface pin/pad 112 in response to signals 119 received from system logic 102 and/or in response to signals 110A received via the serial scan chain. Circuit 116 supplements conventional BSR output cells to capture the state of system logic 102 and to control the associated outgoing signal 121 during internal testing. Like the input cell 114 described above, output cell 116 includes several multiplexers 502, 508, 602 and flip-flop circuits 504, 506 that select the various outputs desired in response to control signals 316, 311, 206, 317 and 315, respectively. Multiplexer 502 suitably selects between the input signal 119 from system logic 102 and the serial input signal 110A in response to control signal 316, and multiplexer 602 selects either the serial output value 110B or a pre-determined value (e.g. ground) in response to testing mode selection signal 206. The output of multiplexer 602 is then applied to interface pad 112 in either the internal or external testing mode. In the exemplary embodiment shown in FIG. 6, interface pin 112 is effectively connected to ground (or another reference voltage) in the internal test mode, thereby providing a known value on output signal 121. In an alternate embodiment, multiplexer 508 could be removed and the reference value could be pre-loaded into circuit 506.

Figure 7:
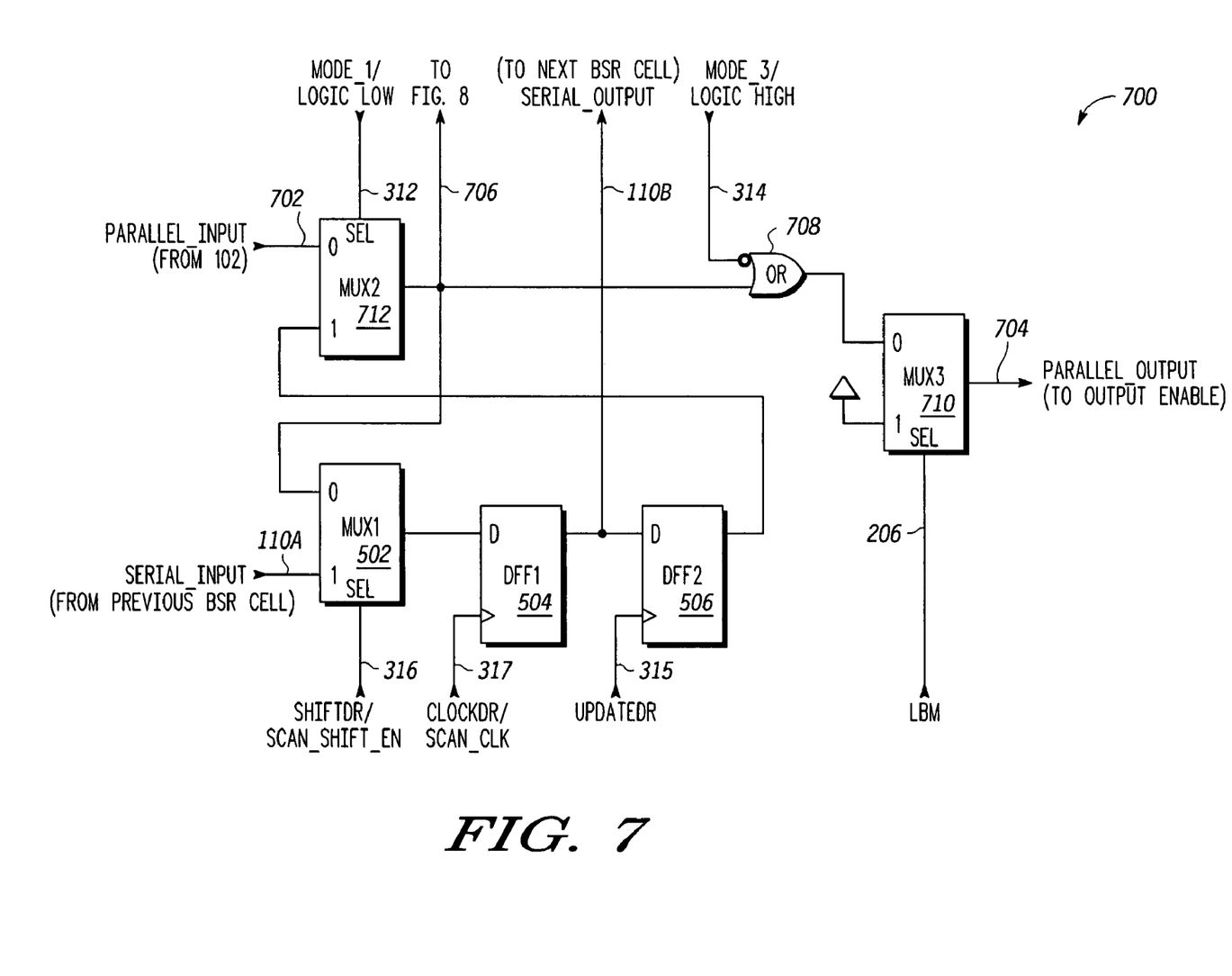
FIG. 7 is a block logic diagram of an exemplary boundary scan tri-state control cell.

FIG. 7 shows an exemplary tri-state control cell/circuit 700 that is suitable for use in enabling an output buffer or the like, as described more fully below. Cell 700 suitably receives an input signal 702 from system logic 102, and provides an output signal 704 to enable a buffer or other component as appropriate. In the internal test mode, circuit 700 provides a signal 704 that is sufficient to disable a buffer or other component (as described more fully below), and additionally captures the output of logic 102 on serial chain 110, thereby providing a mechanism for testing output enable circuitry on chip 100. The exemplary control circuit 700 shown in FIG. 7 includes three multiplexers 502, 710 and 712, as well as two flip-flop circuits 504 and 506. Circuits 502, 504 and 506 selectably place serial input 110A and/or signals 702 received from logic 102 on serial output 110B and/or output 704 in the external test mode. The selected signal can be routed to output signal 704 via multiplexer 710, or in any other manner. Circuit 700 may also provide signal 314 to output signal 704 via an inverting input of OR gate 708 and multiplexer 710. Gate 708 also receives the output 706 of multiplexer 712, for example, which typically corresponds to either the input 702 received from logic 102 or the serial input 110A, depending on the value of signal 312. In an exemplary internal test mode (e.g. when LBM signal 206 is high), output 704 is selectably connected to a reference value (e.g. $V_{DD}$ or another DC reference voltage) by multiplexer 710, although alternate embodiments may provide other values or signals as appropriate. The reference value in the exemplary embodiment of FIG. 7 is selected as $V_{DD}$ to maintain the inverting input of a buffer enable port at a value that deactivates the buffer and isolates logic 102 from interface pin 112, as described more fully below.

Figure 8:
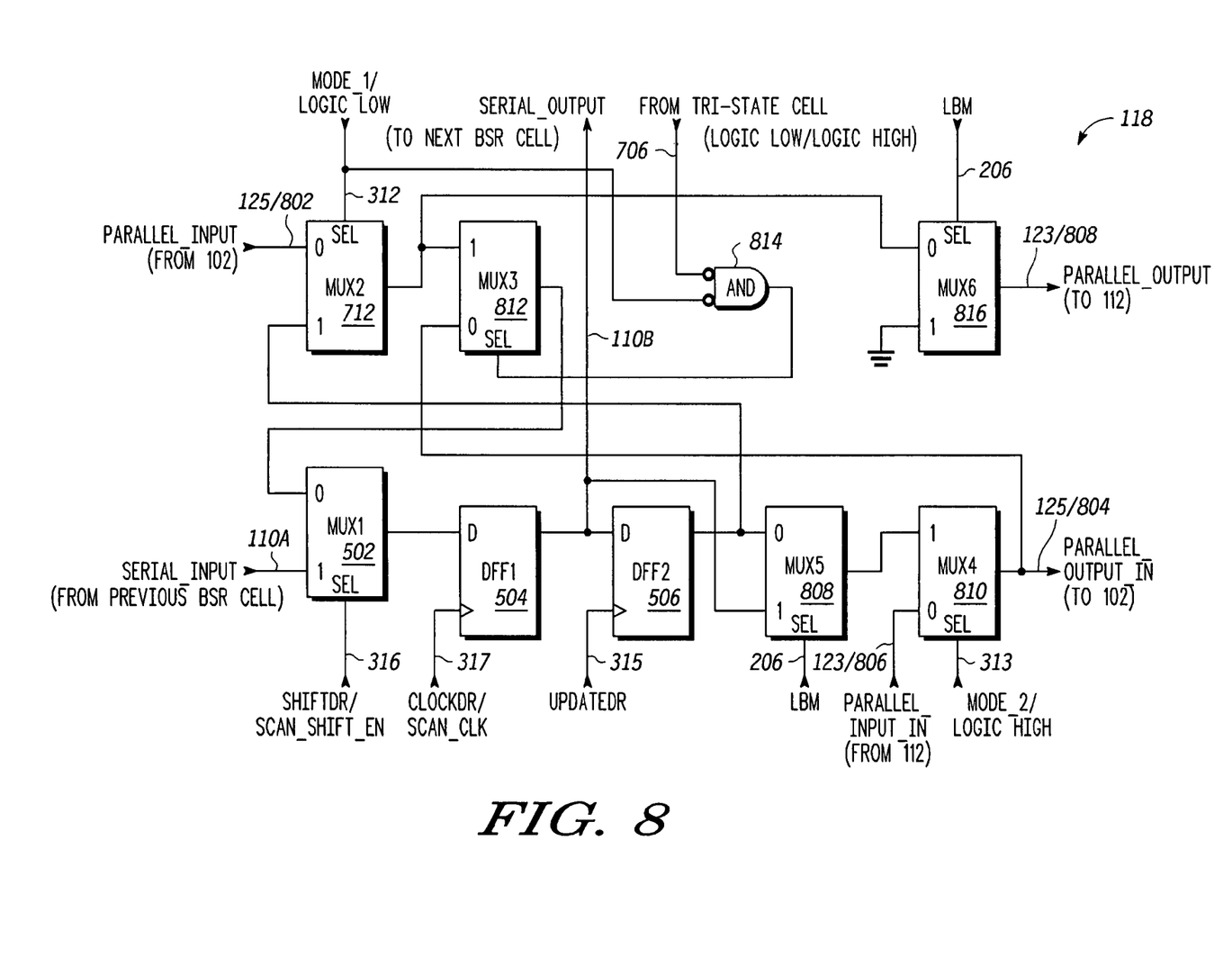
FIG. 8 is a block logic diagram of an exemplary bi-directional boundary scan input/output cell.

FIG. 8 shows an example of a bi-directional input-output circuit 118 that exchanges data between interface pin 112 and system logic 102, and also interacts with serial chain 110. Circuit 118 is shown implemented with six multiplexers 502, 712, 812, 810, 808, 816 and two flip-flop circuits 504, 506, although other embodiments may be created with any numbers and types of alternate circuits. Generally speaking, circuits 712, 812, 814 and 816 provide an input channel for transferring data 802 received from logic 102 to interface pin 112, and circuits 502, 504, 506, 808 and 810 provide a channel for data 804 flowing in the opposite direction. In the standard internal test mode, serial data 110A received at multiplexer 502 can be routed to logic 102 via multiplexer 808 and/or shifted through cell 118 to a subsequent cell via chain 110B. Similarly, inputs 125 received from system logic 102 can be routed on serial output 110B to facilitate testing of logic 102. The output signal 808 provided to interface pin 112 during the internal test mode is typically tied to a reference value (e.g. the ground coupled to multiplexer 816) to further isolate the system logic 102 from external influences. Alternatively, multiplexer 816 could be eliminated in embodiments wherein this feature is not desired.

Data 808 received from system logic 102 can be transferred to serial chain output 110B via either of two paths, depending on the input to multiplexer 812. That is, the output of multiplexer 812 may be provided by multiplexer 712, which receives signal 802 directly, or by multiplexer 810, which corresponds to the data previously scanned into register 504. This feature may be useful in providing particular data values on serial chain 110B. In alternate embodiments, additional logic can be provided to hold the select state of multiplexer 812 in the internal test mode to ensure that the signal provide by multiplexer 812 always corresponds to the input 802 received from logic 102, although this is not required in all embodiments.

Each of the exemplary circuits shown in FIGS. 5-8 expand upon conventional JTAG concepts that are set forth in IEEE Standard 1149.1-1990, as supplemented or amended from time to time. The circuits are intended solely as examples, however, and practical embodiments may be modified or supplemented to implement any sort of standard or non-standard interfaces. Further, the particular logic components shown in FIGS. 5-8 may be replaced or supplemented with any number of equivalent circuits or modules without departing from the concepts set forth herein.

Figure 9:
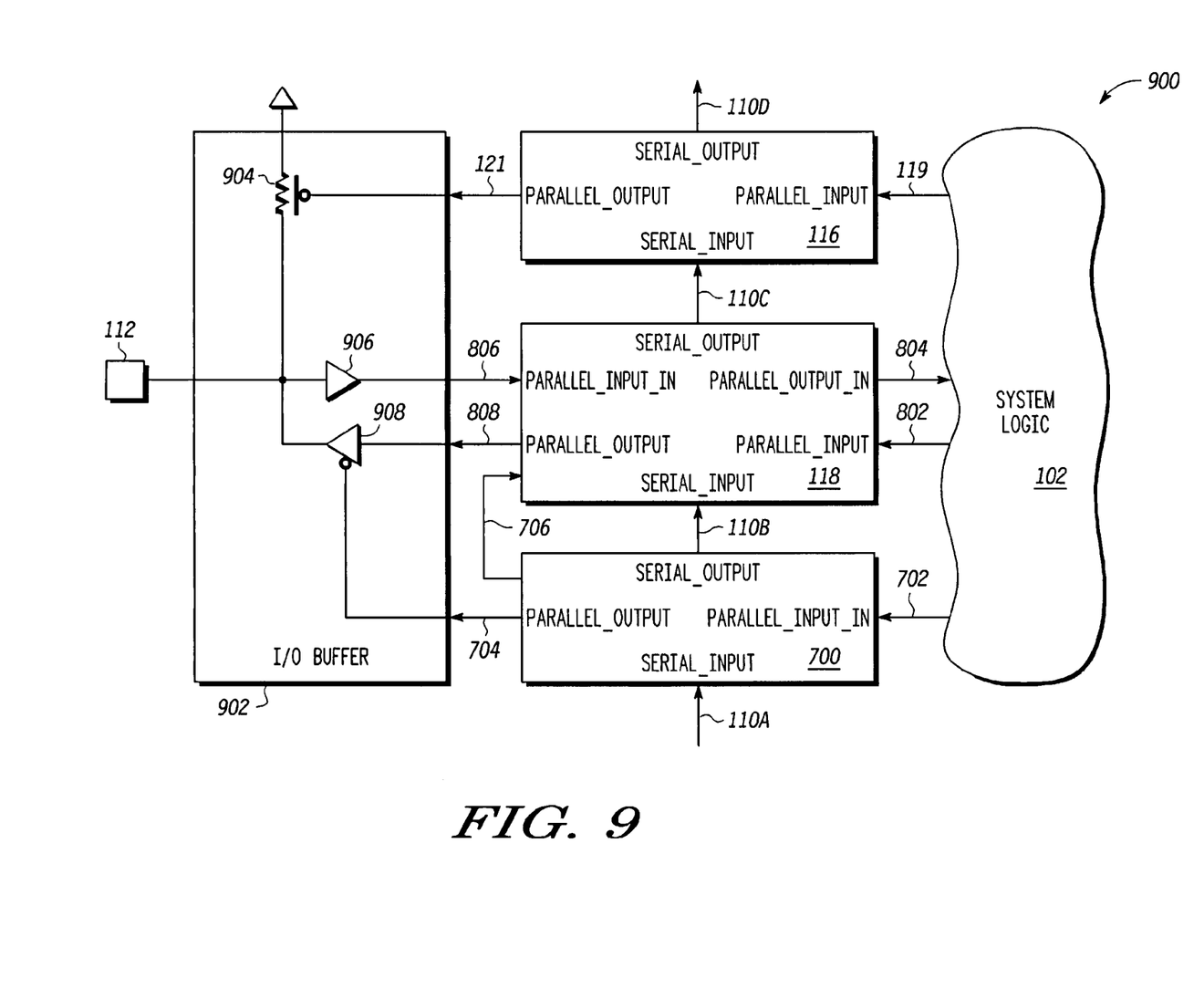
FIG. 9 is a block diagram of an exemplary bi-directional input/output control configuration.

With reference now to FIG. 9, an exemplary bi-directional input/output control circuit 900 for coupling system logic 102 to an interface pin 112 suitably includes an input/output buffer module 902, a buffer enable module 700, a bi-directional input-output cell 118, and an output cell 116 for controlling a resistor 904 used to place buffer 902 into a known state. Buffer module 902 includes an input buffer 906, and output buffer 908 and a resistor 904 that may be coupled to a reference voltage to provide either pull-up or pull-down functionality. The various logic modules 700, 118 and 116 cooperate to form a single interface to pin 112, while providing highly flexible testing capabilities that can be accessed via scan chain 110.

In particular, module 700 provides a buffer control signal 704 to output buffer 908 in response to instructions received via serial chain 110 or from system logic 102 via signal 702. Using the techniques described above with reference to FIG. 7, module 700 provides a tri-state enable 704 that disables/turns off buffer 908 during internal testing, thereby isolating logic 102 from interface pin 112. Module 116 similarly provides a uni-directional output signal 121 to enable or disable resistor 904, thereby placing input signal 806 to module 118 into a known state for internal (or external) testing. During internal testing, then, input buffer 906 can be placed into a known state while output buffer 908 is disabled, thereby providing an excellent environment for testing system logic 102. Moreover, known signal values 804 can be readily applied to logic 102 to implement a variety of internal tests. Conventional BIST vectors, for example, can be transmitted to module 118 via scan chain 110 and applied to logic 102 via signal 804. Results of the scan can be similarly received via signal 802 (and/or signals 119 or 702) and provided back to the BIST module 104 via scan chain 110. Additionally, conventional external testing (e.g. IEEE 1149.1/JTAG testing) can be implemented without significant modification to the BSR circuitry, thereby providing a testing environment that is flexible, powerful, and easy to implement.

Various exemplary embodiments include, but are not limited to, the following:

In various embodiments, a semiconductor device providing access to system logic via a plurality of interface pins comprises a test access port configured to receive an external testing signal from a source outside the semiconductor device, a common plurality of serially-connected boundary shift registers each coupling one of the plurality of interface pins to the system logic, and control logic. The control logic is configured to receive an internal testing signal and to selectably provide the internal testing signal to the plurality of boundary shift registers in an internal testing mode, and to provide the external testing signal to each of the plurality of boundary shift registers in an external test mode to thereby facilitate both internal testing of the system logic and external testing of the interface pins with the common plurality of boundary shift registers. This device may be supplemented with an on-chip test module configured to provide the internal testing signal to the control logic, and/or the internal testing signal may be received from an external device via the test access port, or another source. The internal testing signal may include one or more of a plurality of built-in self test (BIST) or automatic test pattern generation (ATPG) vectors. Further, the boundary scan registers may be configured to form an isolation wrapper around the system logic when in the internal test mode. The external testing signal may be implemented as an IEEE 1149.1 signal or the like. In a further embodiment, the semiconductor device comprises a clock generation circuit configured to receive an internal clock signal and an external clock signal from the source external to the semiconductor device, to select one of the internal and external clock signals in response to the internal and external test modes, respectively, and to provide the selected clock signal to each of the plurality of boundary scan registers. The test access port may comprise a design-specific test data register configured to provide a mode select signal in response to data received from the source external to the semiconductor device. The mode select signal may be provided to the control logic to thereby select between the internal test mode and the external test mode.

Various types of boundary shift registers can be formulated. In various embodiments, at least one of the plurality of boundary shift registers is an input cell comprising a multiplexer configured to selectably apply a predetermined signal value to the system logic in the internal test mode. At least one of the plurality of boundary shift registers may be formulated as an output cell configured to selectably apply a predetermined signal value to one of the plurality of interface pins in the internal test mode and a serial input signal to the one of the plurality of interface pins in the external test mode. At least one of the plurality of boundary shift registers may be formulated a tri-state buffer control configured to selectably apply a tri-state enable signal to an input/output buffer associated with one of the plurality of interface pins. Further, at least one of the plurality of boundary shift registers may be formulated as a bi-directional input-output cell configured to selectably stimulate the system logic with the internal testing signal and to provide a response to the internal testing signal from the system logic via a serial output signal. The bi-directional input-output cell may comprise a first multiplexer configured to selectably provide internal testing signal to the system logic in response to a control signal provided by the control logic, and may further comprise a second multiplexer configured to selectably place a pre-determined signal value on one of the plurality of interface pins.

Other embodiments provide a bi-directional input/output control circuit for coupling an interface pin on a semiconductor chip to system logic present on the semiconductor chip in response to serial test signals received from a testing control circuit on the semiconductor chip. The control circuit suitably comprises an input buffer and an output buffer each coupled to the interface pin, a bias resistor coupling the input and output buffers to a bias signal, and a boundary scan register circuit configured to receive the serial test signals from the test access port. The boundary scan register circuit may comprise a buffer control cell configured to provide an enable signal to the output buffer, a bi-directional input-output cell configured to couple the input and output buffers to the system logic, and a resistor control module configured to selectively activate the bias resistor, and wherein the buffer control cell, input-output cell and resistor control cell are operable to collectively place the control circuit into an internal test mode and an external test mode in response to the serial test signals. In various further embodiments, the buffer control cell is operable to electrically isolate the system logic from the interface pin in response to the serial test signals, and/or the bi-directional input-output cell is further configured to apply at least a portion of the serial input signals to the system logic in the internal test mode and to apply at least a portion of the serial input signals to the interface pin in the external test mode. The bi-directional input/output cell may be further configured to obtain output signals from at least one of the system logic and the interface pin in the internal and external test modes, respectively, and to serially provide the output signals to the testing control circuit in response thereto.

In still other embodiments, a method is provided for performing both an internal test and an external test of a semiconductor chip in response to a received input signal. The semiconductor chip comprises a built-in test module, a test access port and a plurality of serially-connected boundary scan registers each associated with one of a plurality of interface pins. The method comprising several steps. A testing mode selection signal is extracted from the received input signal, wherein the testing mode selection signal has a first value corresponding to the internal test and a second value corresponding to the external test. A plurality of control signals comprising a serial input data signal are generated in response to the testing mode selection signal, the plurality of control signals are applied to the plurality of boundary scan registers to thereby provide the serial input data to the system logic during the internal test and to provide the serial input data to the plurality of interface pins during the external test, and to receive a serial output signal from the plurality of boundary scan registers in response to the serial input data in either the internal or external test. The serial output signal are provided to the built-in self-test module when the testing mode selection signal corresponds to the internal test, and the received serial output signal is provided to the test access port when the testing mode selection signal corresponds to the external test.

While these and other exemplary embodiments have been presented in the foregoing detailed description, it should be appreciated that a vast number of alternate embodiments and equivalent variations exist. Logic BIST features, for example, could be equivalently replaced with externally-applied ATPG features or the like in any of the embodiments described herein. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A semiconductor device providing access to system logic via a plurality of interface pins, the device comprising:
    an on-chip test module contained within the semiconductor device that is configured to generate an internal testing signal;
    a test access port configured to receive an external testing signal from a source outside the semiconductor device;
    a plurality of boundary shift registers each coupling one of the plurality of interface pins to the system logic, wherein each of the plurality of boundary shift registers is coupled to the other boundary shift registers by a common serial chain; and
    control logic configured to receive the internal testing signal from the built-in self test module and to serially scan the internal testing signal into the plurality of boundary shift registers via the common serial chain in an internal testing mode, and to provide the external testing signal to the plurality of boundary shift registers via the common serial chain in an external test mode to thereby facilitate both internal testing of the system logic and external testing of the interface pins with the common serial chain.

2. The semiconductor device of claim 1 wherein the internal testing signal comprises one of a plurality of built-in self test vectors.

3. The semiconductor device of claim 1 wherein the external testing signal is an IEEE 1149.1 signal.

4. The semiconductor device of claim 1 further comprising a clock generation circuit configured to receive an internal clock signal and an external clock signal from the source external to the semiconductor device, to select one of the internal and external clock signals in response to the internal and external test modes, respectively, and to provide the selected clock signal to each of the plurality of boundary scan registers.

5. The semiconductor device of claim 1 wherein the test access port comprises a design-specific test data register configured to provide a mode select signal in response to data received from the source external to the semiconductor device.

6. The semiconductor device of claim 5 wherein the mode select signal is provided to the control logic to thereby select between the internal test mode and the external test mode.

7. The semiconductor device of claim 1 wherein at least one of the plurality of boundary shift registers is an input cell comprising a multiplexer configured to selectably apply a predetermined signal value to the system logic in the internal test mode.

8. The semiconductor device of claim 1 wherein at least one of the plurality of boundary shift registers is an output cell configured to selectably apply a predetermined signal value to one of the plurality of interface pins in the internal test mode and a serial input signal to the one of the plurality of interface pins in the external test mode.

9. The semiconductor device of claim 1 wherein at least one of the plurality of boundary shift registers is a tri-state buffer control configured to selectably apply a tri-state enable signal to an input/output buffer associated with one of the plurality of interface pins.

10. The semiconductor device of claim 1 wherein at least one of the plurality of boundary shift registers is a bi-directional input-output cell configured to selectably stimulate the system logic with the internal testing signal and to provide a response to the internal testing signal from the system logic via a serial output signal.

11. The semiconductor device of claim 10 wherein the bi-directional input-output cell further comprises a first multiplexer configured to selectably provide internal testing signal to the system logic in response to a control signal provided by the control logic.

12. The semiconductor device of claim 11 wherein the bi-directional input-output cell comprises a second multiplexer configured to selectably place a pre-determined signal value on one of the plurality of interface pins.

13. The semiconductor device of claim 1 wherein the internal testing signal is received from an external device via the test access port.

14. The semiconductor device of claim 1 wherein the plurality of boundary scan registers is configured to form an isolation wrapper around the system logic when in the internal test mode.

15. A bi-directional input/output control circuit for coupling an interface pin on a semiconductor chip to system logic present on the semiconductor chip in response to serial test signals received via a common serial chain from a testing control circuit on the semiconductor chip, the bi-directional input/output control circuit comprising:
    an input buffer and an output buffer each coupled to the interface pin;

a bias resistor coupling the input and output buffers to a bias signal; and a boundary scan register circuit configured to receive the serial test signals from the common serial chain and comprising a buffer control cell configured to provide an enable signal to the output buffer, a bi-directional input-output cell configured to couple the input and output buffers to the system logic, and a resistor control module configured to selectively activate the bias resistor, and wherein the buffer control cell, input-output cell and resistor control module are operable to collectively place the control circuit into an internal test mode and an external test mode in response to the serial test signals, and wherein the bi-directional input-output cell is further configured to apply at least a portion of the serial test signals received via the common serial link to the system logic in the internal test mode and to apply at least a portion of the serial test signals received via the common serial link to the interface pin in the external test mode.

16. The control circuit of claim 15 wherein the bi-directional input/output control circuit is operable to electrically isolate the system logic from the interface pin in response to the serial test signals.

17. The control circuit of claim 15 wherein the bi-directional input/output cell is further configured to obtain output signals from at least one of the system logic in the internal test mode and the interface pin in the external test mode, and to serially provide the output signals to the testing control circuit in response thereto.

18. A method of performing both an internal test and an external test of a semiconductor chip in response to a received input signal, wherein the semiconductor chip comprises a built-in test module, a test access port and a plurality of serially-connected boundary scan registers each associated with one of a plurality of interface pins, the method comprising the steps of:

extracting a testing mode selection signal from the received input signal, the testing mode selection signal having a first value corresponding to the internal test and a second value corresponding to the external test;

generating a plurality of control signals in response to the testing mode selection signal, the plurality of control signals comprising a serial input data signal; and applying the plurality of control signals to the plurality of boundary scan registers via a common serial chain to thereby apply the serial input data to the system logic with the plurality of boundary scan registers during the internal test and to provide the serial input data to the plurality of interface pins with the plurality of boundary scan registers during the external test, and to receive a serial output signal from the plurality of boundary scan registers via the common serial chain in response to the serial input data in either the internal or external test; and providing the serial output signal to the built-in self-test module when the testing mode selection signal corresponds to the internal test, and providing the received serial output signal to the test access port when the testing mode selection signal corresponds to the external test.

* * * * *